(12) United States Patent
Jung et al.

(10) Patent No.: US 8,439,719 B2
(45) Date of Patent: May 14, 2013

(54) METHOD OF ENCAPSULATING ORGANIC LIGHT EMITTING DISPLAY DEVICE

(75) Inventors: Woo-Suk Jung, Yongin (KR); Soon-Ryong Park, Yongin (KR); Sa-Bang Um, Yongin (KR); Duk-Jin Lee, Yongin (KR); Jae-Yong Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 27 days.

(21) Appl. No.: 12/801,685

(22) Filed: Jun. 21, 2010

(65) Prior Publication Data
US 2011/0159773 A1    Jun. 30, 2011

(30) Foreign Application Priority Data
Dec. 28, 2009   (KR) .................. 10-2009-0131798

(51) Int. Cl.
*H01J 9/26*    (2006.01)
(52) U.S. Cl.
USPC ............................................................. 445/25
(58) Field of Classification Search .............. 445/24–25; 313/495–512
See application file for complete search history.

(56) References Cited

U.S. PATENT DOCUMENTS

| | | | |
|---|---|---|---|
| 5,874,804 A * | 2/1999 | Rogers | 313/512 |
| 7,223,514 B2 | 5/2007 | Kang et al. | |
| 7,545,094 B2 | 6/2009 | Choi et al. | |
| 2004/0119397 A1 * | 6/2004 | Sakamoto | 313/495 |
| 2005/0110023 A1 | 5/2005 | Lee et al. | |
| 2006/0073406 A1 | 4/2006 | Kang et al. | |
| 2006/0267492 A1 | 11/2006 | Oh | |
| 2007/0090759 A1 | 4/2007 | Choi et al. | |
| 2007/0172971 A1 | 7/2007 | Boroson | |
| 2007/0188079 A1 | 8/2007 | Song et al. | |
| 2007/0194710 A1 | 8/2007 | Song et al. | |
| 2007/0195634 A1 | 8/2007 | Lee | |

(Continued)

FOREIGN PATENT DOCUMENTS

| | | |
|---|---|---|
| JP | 2001319776 A * | 11/2001 |
| KR | 10-2004-0065686 A | 7/2004 |

(Continued)

OTHER PUBLICATIONS

Korean Patent Application No. 10-2009-0120227 which was cited in the Korean Office Action dated Mar. 30, 2011, corresponding to Korean Patent Application No. 10-2009-0131798, together with Request for Entry.

(Continued)

*Primary Examiner* — Anh Mai
*Assistant Examiner* — Elmito Breval
(74) *Attorney, Agent, or Firm* — Robert E. Bushnell, Esq.

(57) ABSTRACT

In a method of encapsulating an organic light emitting display device, when a lower substrate and a encapsulating substrate are encapsulated, the encapsulating process can be simplified since a sealant coating process can be performed without a mask aligning process, thereby reducing manufacturing cost. The method comprises the steps of: preparing an encapsulating substrate for encapsulating a lower substrate on which a display unit, which includes the organic light emitting display device, is formed; forming a black mask on a region of the encapsulating substrate, which is not a sealant region, corresponding to outer regions of the display unit; and forming a sealant on the sealant region.

11 Claims, 4 Drawing Sheets

U.S. PATENT DOCUMENTS

| | | | |
|---|---|---|---|
| 2007/0279571 A1* | 12/2007 | Koo et al. | 349/153 |
| 2008/0106193 A1 | 5/2008 | Jun et al. | |
| 2008/0110561 A1 | 5/2008 | Lee et al. | |
| 2008/0143247 A1 | 6/2008 | Kim et al. | |
| 2008/0297042 A1 | 12/2008 | Ahn et al. | |
| 2009/0026932 A1 | 1/2009 | Kwak et al. | |
| 2009/0058292 A1 | 3/2009 | Koo et al. | |
| 2009/0068917 A1 | 3/2009 | Kim | |
| 2009/0121225 A1* | 5/2009 | Ishizaki et al. | 257/59 |
| 2009/0221109 A1 | 9/2009 | Choi et al. | |
| 2009/0233514 A1 | 9/2009 | Lee et al. | |
| 2009/0236976 A1 | 9/2009 | Lee | |
| 2009/0315450 A1 | 12/2009 | Kim et al. | |
| 2010/0001639 A1 | 1/2010 | Kim et al. | |
| 2010/0007616 A1 | 1/2010 | Jang | |
| 2010/0012966 A1 | 1/2010 | Choi et al. | |
| 2010/0013745 A1 | 1/2010 | Kim et al. | |
| 2011/0008593 A1* | 1/2011 | Abbott et al. | 428/203 |

FOREIGN PATENT DOCUMENTS

| | | |
|---|---|---|
| KR | 1020060027543 A | 3/2006 |
| KR | 1020070047566 A | 5/2007 |
| KR | 1020070077010 A | 7/2007 |
| KR | 1020090011656 A | 2/2009 |
| KR | 1020090013844 A | 2/2009 |
| KR | 10-2009-0100020 A | 9/2009 |
| KR | 1020090120227 | 11/2009 |
| WO | 2009142427 A2 | 11/2009 |

OTHER PUBLICATIONS

Registration Determination Certificate issued by KIPO on Oct. 26, 2011, corresponding to Korean Patent Application No. 10-2009-0131798 and Request for Entry attached herewith.

* cited by examiner

METHOD OF ENCAPSULATING ORGANIC LIGHT EMITTING DISPLAY DEVICE

CLAIM OF PRIORITY

This application makes reference to, incorporates the same herein, and claims all benefits accruing under 35 U.S.C. §119 from an application filed in the Korean Intellectual Property Office on 28 Dec. 2009 and there duly assigned Serial No. 10-2009-0131798.

BACKGROUND OF THE INVENTION

1. Field of the Invention

The present invention relates to a method of encapsulating an organic light emitting display device and, more particularly, to a method of encapsulating an organic light emitting device without needing to perform a mask aligning process when coating on a sealant.

2. Description of the Related Art

In general, an organic light emitting display device (OLED) is an emissive device, and thus, has a wide viewing angle and a high contrast ratio. Also, an organic light emitting display device may be manufactured to be slim and light-weight, and has low power consumption since the organic light emitting display device does not require a backlight.

However, the OLED, and electrodes and organic layers included in the OLED, are prone to degrade due to reaction with oxygen and moisture penetrating therein. Therefore, methods of tightly sealing the OLED to prevent the electrodes and organic layers included in the OLED from being exposed to external elements have been researched.

A cap-shaped sealing member having grooves is conventionally formed from a metal can or a glass substrate, and a moisture absorbent for absorbing moisture is loaded on the grooves in a powder form or a film attached to the grooves by using a dual-sided tape. The sealing member is then attached to a substrate on which an OLED is formed by using an ultra violet (UV) hardening sealant or a thermal hardening sealant. However, this method is disadvantageous in terms of high material and process costs due to accompanying manufacturing processes, such as a mask aligning process, when coating on the sealant.

Also, an OLED may be sealed via a film instead of a metal can or a substrate. In this case, however, there is a limit in preventing moisture from penetrating therein, and there is a high possibility of the OLED being damaged during manufacturing and when using it, thereby reducing durability and reliability. Accordingly, it is difficult to mass produce.

In another method, frit may be formed between a lower substrate and an upper substrate. This method may effectively protect an OLED without needing to use a moisture absorbent. However, the method is disadvantageous in view of deformation since frit has poor ductility and malleability characteristics. Therefore, when an OLED having frit is exposed to an external impact, a crack may be generated in the frit. As a result, the frit may become detached from the OLED or the OLED may be damaged.

SUMMARY OF THE INVENTION

To address the above and/or other problems, the present invention provides a method of combining a sealing member with a substrate on which an organic light emitting display device (OLED) is formed using a simple process.

According to an aspect of the present invention, a method of encapsulating an OLED includes the steps of: preparing an encapsulating substrate for encapsulating a lower substrate on which a display unit, which includes the organic light emitting display device, is formed; forming a black mask on a region of the encapsulating substrate except a sealant region corresponding to outer regions of the display unit; and forming a sealant on the sealant region.

The forming of the sealant may include: coating a first sealant in the sealant region; annealing the first sealant; and coating a second sealant in the sealant region.

The first sealant may be a primer.

The second sealant may be an ultraviolet (UV) hardening epoxy resin.

The UV hardening-epoxy resin may include fluoride.

The sealant may be formed using a screen printing method.

The method may further include: removing the black mask; combining the encapsulating substrate with the lower substrate; and hardening the sealant using a UV ray.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
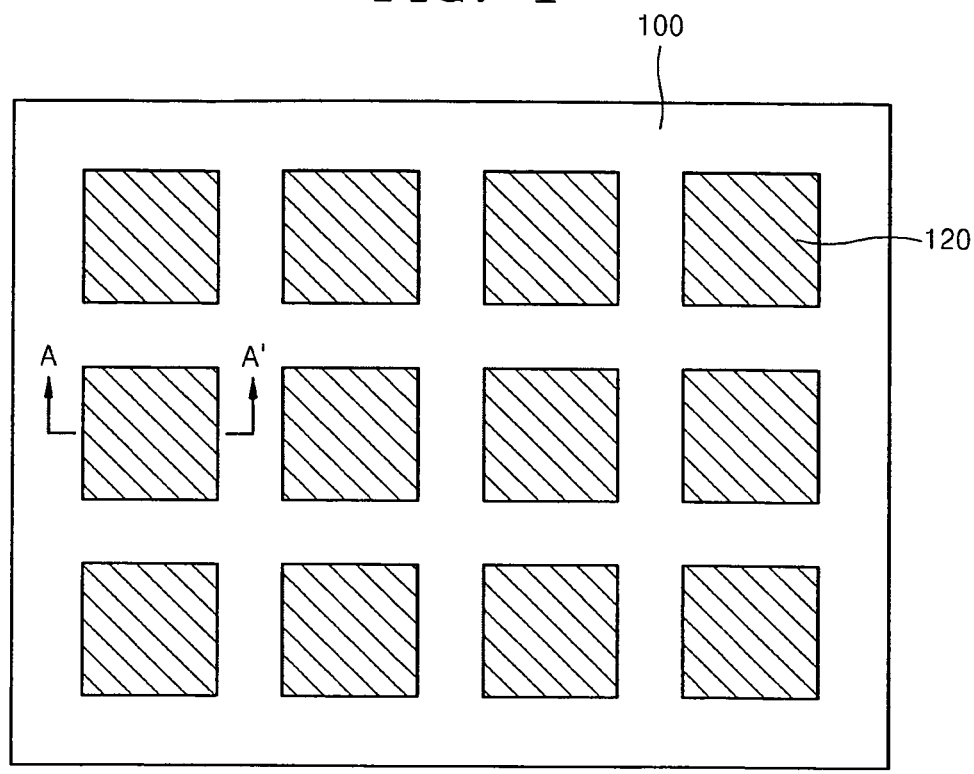
FIG. 1 is a plan view of a lower substrate on which an organic light emitting display device is formed according to an embodiment of the present invention.

The present invention will now be described more fully with reference to the accompanying drawings in which exemplary embodiments of the invention are shown. In the drawings, the thicknesses of layers and regions are exaggerated for clarity. Like reference numerals in the drawings denote like elements. In explaining the present invention, some detailed descriptions with respect to related well-known functions or structures will be omitted if detailed descriptions could unnecessarily make unclear the present invention.

In addition, when it is said that a unit "includes" an element, it denotes that the element is not excluded but may further include the element if there is no specific opposite description.

FIGS. 1 thru 6 are drawings for explaining a method of encapsulating an organic light emitting display device (OLED) according to an embodiment of the present invention.

Figure 2:
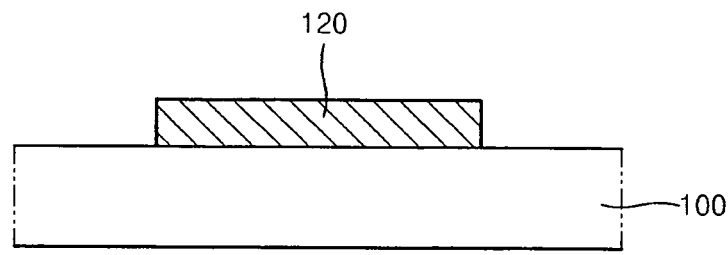
FIG. 2 is a cross-sectional view taken along line A-A' of FIG. 1.

FIG. 1 is a plan view of a lower substrate on which an organic light emitting display device is formed; FIG. 2 is a cross-sectional view taken along line A-A' of FIG. 1; and FIG. 3 is an enlarged cross-sectional view of an organic light emitting panel of FIG. 1.

Referring to FIGS. 1 and 2, a plurality of organic light emitting panels 120 are simultaneously formed on a lower substrate 100. The organic light emitting panels 120 form an organic light emitting display device. FIG. 1 shows an example of the lower substrate 100 having 12 organic light emitting panels 120. However, the number of panels is not limited thereto.

The lower substrate 100 may be formed of a glass material, but is not limited thereto, and it may also be formed of a plastic material or a metal foil. Hereinafter, the lower substrate 100 formed of a glass material will be described.

Figure 3:
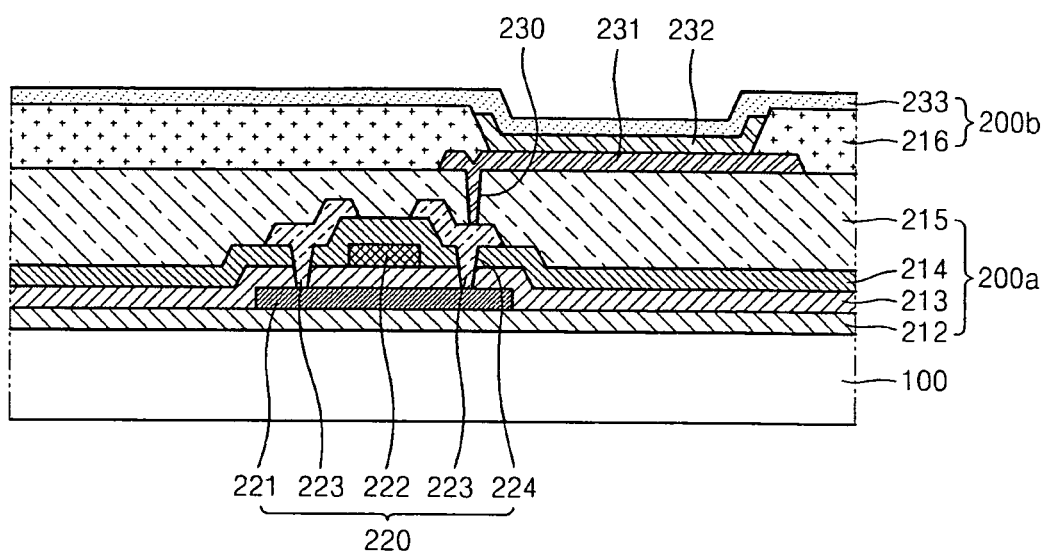
FIG. 3 is an enlarged cross-sectional view of an organic light emitting panel of FIG. 1.

The organic light emitting panel 120 may include an organic thin film transistor layer 200a and a pixel unit 200b as depicted in FIG. 3.

An insulating layer 212 as a barrier layer and/or as a buffer layer may be formed on an upper surface of the lower substrate 100 to prevent the diffusion of dopant ions, to prevent penetration of moisture or external air, and to planarize the upper surface.

A thin film transistor (TFT) 220 as a driving circuit is formed on the insulating layer 212. In the current invention, a top gate type TFT is shown. However, a TFT which is not a top gate type may instead be included.

An active layer 221 of the TFT 220 is formed on the insulating layer 212 by using a semiconductor material, and a gate insulating layer 213 is formed to cover the active layer 221. The active layer 221 may be formed of an inorganic or organic semiconductor material such as amorphous silicon or poly silicon, and has a source region, a drain region, and a channel region between the source and drain regions.

A gate electrode 222 is formed on the gate insulating layer 213, and an interlayer insulating layer 214 is formed to cover the gate electrode 222. Source and drain electrodes 223 are formed on the interlayer insulating layer 214, and then a planarizing film 215 is formed to cover the source and drain electrodes 223.

The TFT 220 is not limited to the stacking structure described above, and the TFT 220 may have any of various other structures.

A first electrode 231 of the OLED is formed on the planarizing film 215, and is electrically connected to one of the source and drain electrodes 223 through a contact hole 230.

A second electrode 233 is formed over and facing the first electrode 231.

The first electrode 231 functions as an anode electrode, and the second electrode 233 functions as a cathode electrode. Of course, the polarities of the first electrode 231 and the second electrode 233 may be reversed.

The first electrode 231 may be used as a transparent electrode or as a reflection electrode. When the first electrode 231 is used as a transparent electrode, the first electrode 231 may be formed of ITO, IZO, ZnO or $In_2O_3$, and when the first electrode 231 is used as a reflection electrode, the first electrode 231 may include a reflection film formed of Ag, Mg, Al, Pt, Pd, Au, Ni, Nd, Ir, Cr, or a compound of these metals, and a transparent film formed of ITO, IZO, ZnO or $In_2O_3$. The second electrode 233 can also be used as a transparent electrode or as a reflection electrode. When the second electrode 233 is used as a transparent electrode, the second electrode 233 may include a film formed by depositing Li, Ca, LiF/Ca, LiF/Al, Al, Ag, Mg, or a compound of these metals so as to face an intermediate layer and an auxiliary electrode or a bus electrode line formed of a transparent conductive material such as ITO, IZO, ZnO or $In_2O_3$ on the film. When the second electrode layer 233 is used as a reflection electrode, the second electrode layer 233 may be formed of Li, Ca, LiF/Ca, LiF/Al, Al, Mg, or a compound of these metals.

As described above, when the lower substrate 100 includes a TFT, the first electrode 231 patterned in each of sub-pixels is electrically connected to the TFT of each of the sub-pixels. At this point, the second electrodes 233 in the sub-pixels may be formed as common electrodes which are connected to each other. When the lower substrate 100 does not include a TFT in each of the sub-pixels, the first electrode 231 and the second electrode 233 may be driven in a passive matrix (PM) manner by being patterned as stripe patterns which cross each other.

An organic film 232 is interposed between the first electrode 231 and the second electrode 233.

The organic film 232 may be formed of a low molecular weight organic material or a polymer organic material.

When the organic film 232 is formed of a low molecular weight organic material, the organic film 232 may be formed so as to have a single or complex structure by stacking a hole injection layer (HIL), a hole transport layer (HTL), an emission layer (EML), an electron transport layer (ETL), and an electron injection layer (EIL), etc. The organic film 232 may be formed of any of various organic materials such as copper phthalocyanine (CuPc), N,N'-Di(naphthalene-1-yl)-N,N'-diphenyl-benzidine (NPB), or tris-8-hydroxyquinoline aluminum (Alq3). The low molecular organic material film can be formed by using an evaporation method.

If the organic film 232 is formed of a polymer organic material, the organic film 232 may have a structure including an HTL and an EML. The HTL may be formed of poly-(2, 4)-ethylene-dihydroxy thiophene (PEDOT) and the EML may be formed of poly-phenylenevinylene (PPV), soluble PPV's, cyano-PPV, or polyfluorene, and may be formed using a screen printing method or an inkjet printing method.

The organic film 232 is not limited to the organic materials described above, and any of various other organic materials may be used.

A passivation film having stack layers, each comprising an inorganic material, an organic material, or an inorganic-organic composite material, may further be formed on the second electrode 233 of the organic light emitting panel 120 so as to cover the organic light emitting panel 120.

The lower substrate 100, on which the organic light emitting panel 120 is formed, is sealed by an encapsulating substrate by forming a sealant between the lower substrate 100 and the encapsulating substrate.

Figure 4:
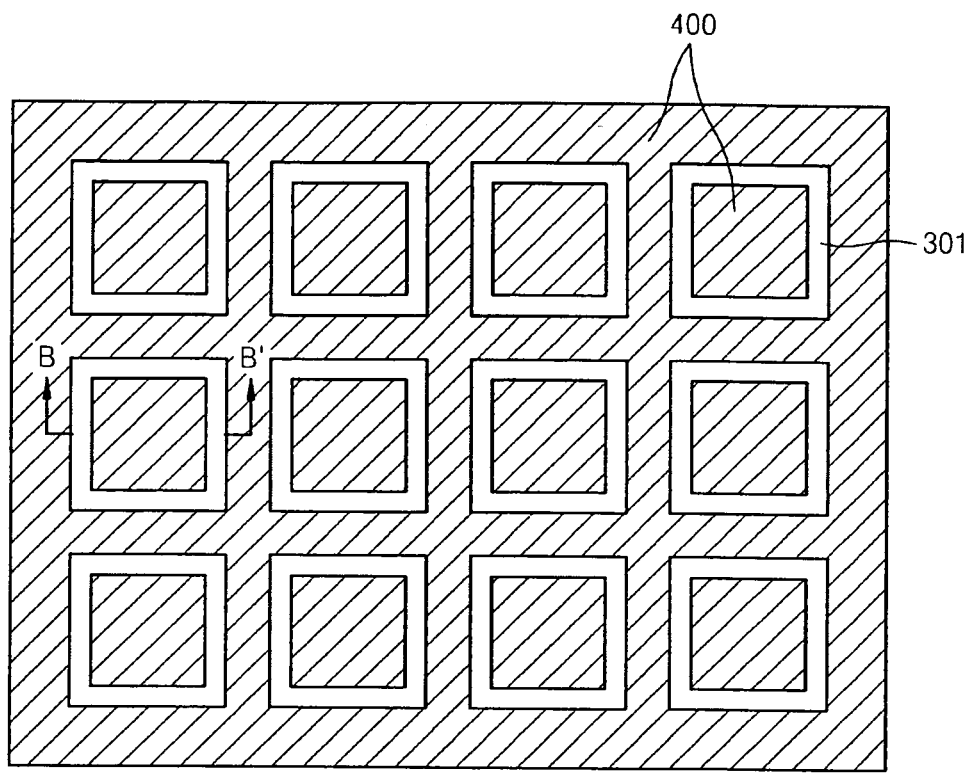
FIG. 4 is a plan view of an encapsulating substrate on which a black mask is formed according to an embodiment of the present invention.
Figure 5:
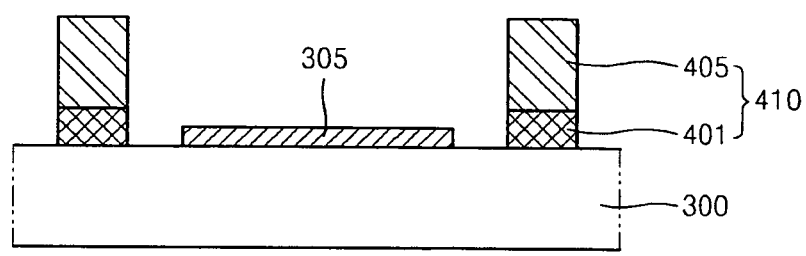
FIG. 5 is a cross-sectional view, taken along line B-B' of FIG. 4, of the encapsulating substrate of FIG. 4 after a sealant is formed on the encapsulating substrate and the black mask is removed.

FIG. 4 is a plan view of an encapsulating substrate on which a black mask is formed according to an embodiment of the present invention; FIG. 5 is a cross-sectional view, taken along line B-B' of FIG. 4, of the encapsulating substrate of FIG. 4 after a sealant is formed on the encapsulating substrate and the black mask is removed; and FIG. 6 is a cross-sectional view of an organic light emitting display device after the organic light emitting display device is sealed according to an embodiment of the present invention.

Figure 6:
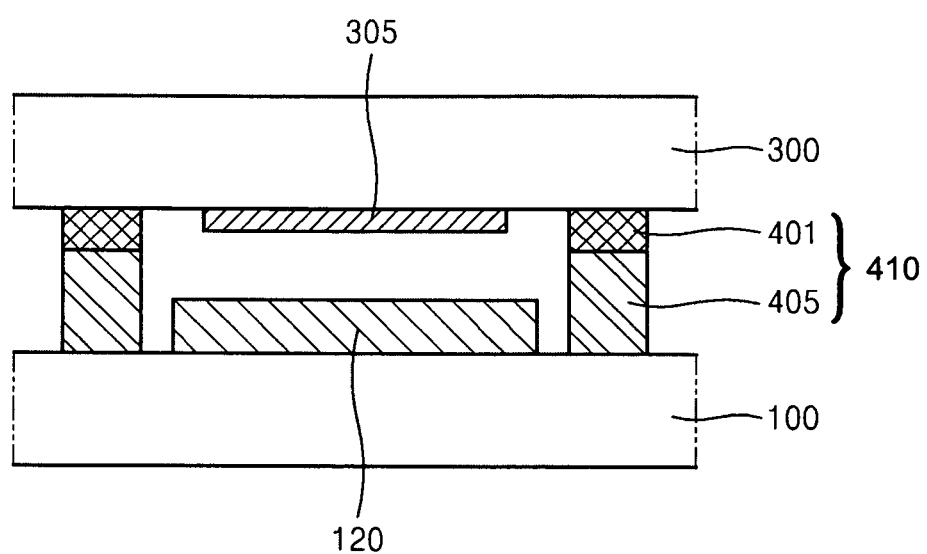
FIG. 6 is a cross-sectional view of an organic light emitting display device after the organic light emitting display device is sealed according to an embodiment of the present invention.

Referring to FIGS. 4 thru 6, encapsulating substrate 300 for sealing the lower substrate 100 of FIGS. 1 thru 3 is provided, and the black mask 400 is formed on the encapsulating substrate 300.

The encapsulating substrate 300 may be formed of a glass material, but is not limited thereto, and may also be formed of a plastic or metal cap. Hereinafter, the encapsulating substrate 300 formed of a glass material will be mainly described.

An inlet unit having a predetermined depth may be etched on a surface of the encapsulating substrate 300 (FIG. 5) facing the lower substrate 100 (FIGS. 1 thru 3). An absorbent 305 (FIG. 5) may be additionally formed on the surface of the encapsulating substrate 300 facing the lower substrate 100 and, if the inlet unit is etched, the absorbent 305 may be formed in the inlet unit. The absorbent 305 may be $P_2O_2$, BaO, CaO, or any absorbent which can absorb moisture and, preferably, it may be an absorbent which can maintain transparency after absorbing moisture.

A sealant 410 (FIG. 5) corresponding to an outer side of the organic light emitting panel 120 of the lower substrate 100 of FIG. 2 is formed on the encapsulating substrate 300. The black mask 400 of FIG. 4 is formed on the encapsulating substrate 300 to form the sealant 410.

The black mask 400 is formed on the encapsulating substrate 300 excluding a sealant region 301 (FIG. 4) where the sealant 410 is formed. The black mask 400 may be formed of a black resin or a metal, and preferably is a material that does not deform in a following thermal treatment process performed on the coated sealant 410. The black mask 400 is formed by patterning a black mask material which is stacked on the encapsulating substrate 300, but is not limited thereto, and may be formed using any of various well known methods.

The sealant 410 may be formed on the encapsulating substrate 300 using a screen printing method, and includes a first sealant 401 and a second sealant 405 (FIG. 5).

Initially, the first sealant 401 is coated on the encapsulating substrate 300 on which the black mask 400 is attached. The first sealant 401 is a primer used to reinforce a bonding force between the second sealant 405 and the encapsulating substrate 300, and may be formed of a vinyl resin.

The first sealant 401 is coated on the sealant region 301 where the black mask 400 is not formed by using a squeezing method. Thus, the first sealant 401 has a closed loop shape which surrounds outer regions of the organic light emitting panel 120 of the lower substrate 100.

The coated first sealant 401 is annealed with the attached black mask 400.

After the first sealant 401 is annealed, the second sealant 405 is coated on the encapsulating substrate 300. The second sealant 405 may be formed of a UV hardening epoxy resin, and preferably, a UV hardening epoxy resin which contains fluoride. Although a fluoride resin is superior in blocking penetration of moisture, the fluoride may reduce a bonding force. Therefore, the first sealant 401 is coated prior to the second sealant 405, and thus, the second sealant 405 may be bonded more strongly to the encapsulation substrate 300 due to the first sealant 401. The second sealant 405 may further include a filler such as a photoinitiator and an acryl resin, a hardening agent comprising an amine group, or alumina powder which causes a polymerization reaction by absorbing UV energy when UV is irradiated on the second sealant 405.

The second sealant 405 (FIG. 5) is coated on the sealant region 301 (FIG. 4) where the black mask 400 is not formed by using a squeezing method. Therefore, the second sealant 405 has a closed loop shape together with the first sealant 401 so as to surround the outer regions of the organic light emitting panel 120 of the lower substrate 100.

In the current invention, after the black mask 400 is formed on the encapsulating substrate 300, the first sealant 401 and the second sealant 405 are sequentially coated on the encapsulating substrate 300 on which the black mask 400 is attached. Therefore, mask aligning processes required for coating the first sealant 401 and the second sealant 405, respectively, on the encapsulating substrate 300 may be omitted. Next, the black mask 400 is removed.

FIG. 5 is a cross-sectional view, taken along line B-B' of FIG. 4, of the encapsulating substrate of FIG. 4 after a sealant is formed on the encapsulating substrate and the black mask is removed.

The encapsulating substrate 300, from which the black mask 400 is removed, is combined with the lower substrate 100. At this point, the encapsulating substrate 300 is disposed so that the sealant 410 corresponds to the outer regions of the organic light emitting panel 120.

The first and second sealants 401 and 405, respectively, are hardened by radiating a UV ray thereon, and thus, the lower substrate 100 is combined with the encapsulating substrate 300. A space is formed between the encapsulating substrate 300 and the lower substrate 100 since the encapsulating substrate 300 is separated from the lower substrate 100 by a predetermined distance. The space may be filled with a colorless solid or liquid filler. The filler may be formed of an organic material such as a urethane group resin or an acrylic resin or an inorganic material such as silicon. At this point, the urethane group resin may be, for example, urethane acrylate, and the acrylic resin may be, for example, butylacrylate, or ethylacrylate. As an alternative, the space may be filled with an inert gas or it may be maintained as an air-gap.

Next, a plurality of display devices are completely manufactured by cutting regions between the organic light emitting panels 120.

FIG. 6 is a cross-sectional view of an organic light emitting panel after cutting out of the organic light emitting panel.

The method of encapsulating an organic light emitting display device according to an embodiment of the present invention can maximize the bonding force between the lower substrate 100 and the encapsulating substrate 300 by coating a sealant 410 in two steps. Also, two processes of aligning a mask with the encapsulating substrate 300 for coating the sealant may be omitted since the sealant 410 is coated by forming the black mask 400 on the encapsulating substrate 300.

In the present invention, when lower substrate 100 and encapsulating substrate 300 are combined, a bonding force between the lower substrate 100 and the encapsulating substrate 300 may be maximized by coating the sealant in two steps.

Also, in the present invention, two sealant coating processes can be performed without needing to perform mask aligning processes since the sealant is formed using a black mask, thereby reducing manufacturing cost and increasing productivity.

While the present invention has been particularly shown and described with reference to exemplary embodiments thereof, it will be understood by one of ordinary skill in the art that various changes in form and detail may be made therein without departing from the spirit and scope of the present invention. Therefore, the scope of the invention is defined not by the detailed description of the invention but by the appended claims.

What is claimed is:

1. A method of encapsulating an organic light emitting display device, comprising:
    preparing an encapsulating substrate to encapsulate a lower substrate on which a display unit is arranged, the display unit includes the organic light emitting display device;
    forming a black mask on portions of the encapsulating substrate that do not correspond to a sealant region;
    applying a first sealant onto the encapsulation substrate within the region where the black mask is not formed and on the surface of the encapsulation substrate that the black mask is arranged; and
    applying a second sealant onto the first sealant and within the sealant region where the black mask is not formed, the second sealant comprising a fluoride, the second sealant is applied directly onto the first sealant.

2. The method of claim 1, wherein the first sealant is a primer layer and includes a vinyl resin, the second sealant being an ultraviolet hardening epoxy resin that includes a fluoride.

3. The method of claim 1, wherein each of the first sealant and the second sealant are applied via a squeezing process.

4. The method of claim 1, further comprising annealing the first sealant upon said application of the first sealant and prior to said application of the second sealant.

5. The method of claim 1, further comprising:
removing the black mask;
combining the encapsulating substrate to the lower substrate; and
hardening the first and second sealants by using a UV ray.

6. The method of claim 1, further comprising annealing the first sealant prior to the applying of the second sealant, wherein the second sealant is a UV hardening epoxy resin arranged only on the annealed first sealant.

7. A method of encapsulating an organic light emitting display device, the method comprising:
preparing an encapsulating substrate to encapsulate a lower substrate on which a display unit, which includes the organic light emitting display device, is formed;
forming a black mask on a region of the encapsulating substrate, which is not a sealant region and corresponding to outer regions of the display unit;
forming a first sealant on the encapsulation substrate and in the sealant region and a second sealant onto the first sealant, wherein the forming of the first and second sealants comprise:
coating the first sealant in the sealant region;
annealing the first sealant; and
coating the second sealant onto the annealed first sealant, wherein the second sealant is a UV hardening epoxy resin arranged only on the annealed first sealant.

8. A method of encapsulating an organic light emitting display device, comprising:
preparing an encapsulating substrate to encapsulate a lower substrate on which a display unit is arranged, the display unit includes the organic light emitting display device;
forming a black mask on all portions of a surface of the encapsulating substrate outside of a sealant region;
applying a first sealant onto a portion of the surface of the encapsulation substrate that corresponds to the sealant region, the first sealant being absent of a fluoride;
annealing the first sealant;
applying a second sealant onto the annealed first sealant and within the sealant region, the second sealant including a fluoride, wherein the second sealant is applied directly to the first sealant and is in direct contact with the lower substrate;
removing the black mask from the encapsulating substrate;
combining the lower substrate with the encapsulating substrate together; and
hardening the first and second sealants via exposure to UV radiation, wherein the black mask does not serve as an exposure mask during the hardening.

9. The method of claim 8, the first sealant being a vinyl resin and being a primer layer for the second sealant.

10. The method of claim 8, wherein the application of the first and second sealants is by a squeezing technique using the black mask as a pattern.

11. The method of claim 8, wherein the second sealant is arranged only on the annealed first sealant.

* * * * *